United States Patent [19]

Varmazis

[11] Patent Number: 5,698,875
[45] Date of Patent: Dec. 16, 1997

US005698875A

[54] METAL-SEMICONDUCTOR FIELD EFFECT TRANSISTOR HAVING REDUCED CONTROL VOLTAGE AND WELL CONTROLLED PINCH OFF VOLTAGE

[75] Inventor: Costas Dimitrios Varmazis, Chelmsford, Mass.

[73] Assignee: The Whitaker Corporation, Wilmington, Del.

[21] Appl. No.: 641,299

[22] Filed: Apr. 30, 1996

[51] Int. Cl.⁶ .......................... H01L 29/80; H01L 31/112
[52] U.S. Cl. .......................................................... 257/280
[58] Field of Search ............................................. 257/280

[56] References Cited

PUBLICATIONS

*IEEE Electron Device Letters;* "Improved GaAs Power FET Performance Using Be Co-Implantation"; vol. EDL-8; Mar. 1987; Macksey et al.
*Electronics Letters;* "GaAs MESFETS With a Buried p-Layer for Large-Scale Integration"; vol. 20; pp. 98-100; Jan. 1984; Y. Umemoto et al.
*IEEE Trans. Electron Devices;* "Buried p-layer Saint for very high-speed GaAs LSI's with submicrometer gate length"; vol.ED-32; pp. 2420-2425; Nov. 1985; K. Yamasuki et al.

*Primary Examiner*—Stephen Meier
*Attorney, Agent, or Firm*—W. S. Francos

[57] ABSTRACT

A metal semiconductor field effect transistor (MESFET) having a reduced control voltage while maintaining appropriate performance characteristics is disclosed. The MESFET is fabricated by a two step implantation technique for fabricating the ohmic contact region in the channel between the source and drain. This implant process results in higher doping levels of the active channel and a increased conductivity. Additionally, this step defines the channel depth, which in turn defines the pinch-off voltage. In the preferred embodiment of the present invention, the channel thickness is on the order of 2000 Angstroms. Parasitic capacitance is reduced to an acceptable level by reduction in the gate length. Finally, after the implantation of donor dopants to effect the active channel, a suitable acceptor dopant, preferably beryllium, is implanted to produce a well defined channel boundary, to reduce the donor dopant tails. This facilitates the control of the pinch-off voltage.

20 Claims, 5 Drawing Sheets

METAL-SEMICONDUCTOR FIELD EFFECT TRANSISTOR HAVING REDUCED CONTROL VOLTAGE AND WELL CONTROLLED PINCH OFF VOLTAGE

FIELD OF THE INVENTION

The present invention relates to a MESFET having a reduced control voltage and an improved control over pinch off voltage and breakdown voltage.

BACKGROUND OF THE INVENTION

Gallium arsenide semiconductor devices form the basis for a large portion of the high frequency communications industry. To this end, rf and microwave electronics, which form the basis of the wireless industry, rely heavily on gallium arsenide devices for high speed analog and digital communications. One of the devices which plays a vital role in the wireless industry is the gallium arsenide based metal-semiconductor field effect transistor (MESFET). The basic MESFET is as shown in FIG. 1. A semi-insulating gallium arsenide substrate 101 is implanted to an acceptable level to form a conductive channel 102 using silicon or other suitable donor dopants. The source and drain are doped heavily to form not only the source and drain of the device but also the proper ohmic contact region. The gate 103 forms a natural Schottky barrier with the channel 102. With zero bias voltage applied, the built in voltage of the Schottky barrier creates a depletion region in the channel. While the MESFET will conduct current between the source and drain in this state, to increase conductivity in the channel, the gate may be biased positively with respect to the channel so that the depletion region is narrowed and the channel is more conductive. Whether the gate is zero-biased or positively biased, the channel is conductive. In most practical applications, zero bias is applied to the gate. For a negative gate bias, the depletion region extends into the channel and with increased negative bias, a condition of very low conductivity is achieved in the channel wherein the depletion region extends across through the entire thickness of the channel resulting in what is known as the pinch off condition. In practice, while pinch-off may be at a given level, voltage on the order of 2–2.5 times the pinch off voltage is applied to assure the device is in off state.

Accordingly, from this basic explanation of a MESFET, it can be appreciated that the gate establishes a natural current valve for current traveling between the source and the drain by the control of mobile carriers in the channel. Application of a positive voltage between the drain and source results in conduction of current between the source and the drain. For a given gate voltage $V_{gs}$, the application of a given voltage between the drain and the source $V_{ds}$, results in a prescribed drain current. As is well known to one of ordinary skill in the art, a plot of the $I_d$-$V_{ds}$ curves for prescribed $V_{gs}$, results in the I-V transfer characteristics for the MESFET. These curves generally have a relatively large increase in drain current per unit increase for $V_{ds}$ to a point at which the curves become relatively flat. The region where the curves of $I_d$ versus $V_{ds}$ are relatively flat is known as the saturation region. In the saturation region, a change in drain voltage $V_{ds}$ results in little or no increase in drain current. Finally, because of the electrical requirements in the operation of a device the reverse breakdown voltages in the gate-source and gate-drain diodes are important parameters in characterizing a device.

In standard control devices, typical MESFETs as shown in FIG. 1 have been fabricated through standard implant processes. Such devices are made to operate at a particular control voltage, a voltage of the order of approximately 5 volts. The fundamental device parameters that define the required control device bias condition for efficient operation are the pinch off voltage and the breakdown voltage. Conventional devices have a pinch off voltage of the order of 2 volts and a breakdown voltage greater than 10 volts which make them suitable for a 5 volt operation. However, there is a need in the wireless communications industry for the same performance levels of wireless components at reduced control bias voltages. For example, one of the important electrical parameters of a gallium arsenide control device is the one dB compression point ($P_{1db}$). $P_{1db}$ is a measure of the linearity of the device. As the input of the device is increased by 1 dB, the output power should also increase by 1 dB. As the input power is increased a point is reached where the output power does not increase by the same amount as the input power. This point is known as the compression point. $P_{1db}$ is the point of compression where the difference between the measured output power is 1 dB below that which would be expected due to an increase in the input power. This parameter, as well as the basic requirement to operate at high frequencies must be maintained independent of the bias voltage.

Accordingly, what is needed is a device that will operate at a lower and more controlled pinch-off voltage with the same performance. This will allow the user of any type of battery operated system to utilize a lower voltage and extend the battery life.

SUMMARY OF THE INVENTION

The present invention relates to a metal-semiconductor field effect transistor having a reduced control voltage while maintaining the appropriate performance characteristics required in the wireless industry. The MESFET of the present invention utilizes a two step implantation technique for fabricating ohmic contact region and the channel between the source and the drain in the MESFET. This implant process results in higher doping levels of the active channel and subsequently an increased conductivity. Additionally, this step defines the channel depth, which in turn defines the pinch-off voltage. To this end, the pinch-off voltage is proportional to the square of the channel depth and proportional to the doping level. To reduce the pinch-off voltage, the present invention reduces the channel depth by lowering the energy of the channel implant. Reducing the pinch-off voltage saves DC battery life as is desired. In the preferred embodiment of the present invention, the channel thickness is on the order of 2000 Angstroms. Unfortunately, the increased doping levels would result in increased capacitance of the control device FETs. Because parasitic capacitance adversely affects the frequency response of a device, it is essential that the device capacitance be reduced to an acceptable level. The present invention embodies this requirement, by the reduction in the gate length. Finally, after the ion implantation of the donor dopants to effect the active channel, a suitable acceptor dopant, preferably beryllium, is introduced through standard ion implantation techniques. This implantation of beryllium produces a well defined channel boundary and reduces the donor dopant tails which are often produced in the initial implantation process in fabricating the active channel. The tails of mobile carriers can adversely affect the control of the pinch-off voltage and are accordingly not desired. By creating the barrier defining the interface with beryllium between the substrate and the channel at the right depth, the pinch-off voltage is well controlled through the elimination of stray currents.

OBJECTS, FEATURES AND ADVANTAGES

It is an object of the present invention to have a field effect transistor having reduced pinch-off voltage to increase the DC power supply life while maintaining performance characteristics at a suitable level for the wireless industry.

It is a further object of the present invention to have a well controlled pinch off voltage in the field effect transistor.

It is a feature of the present invention to introduce donor dopants in the active channel of the FET at a suitable level and depth to effect the reduced pinch-off voltage.

It is a further feature of the present invention to have a well defined channel through the introduction of a suitable acceptor dopant through ion implantation.

It is an advantage of the present invention to extend the DC power supply life in a wireless unit through the use of a reduced pinch off voltage control FET.

DETAILED DESCRIPTION OF THE PREFERRED EMBODIMENT

Figure 1:
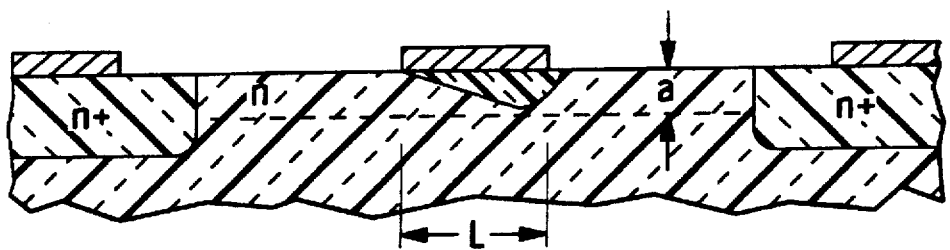
FIG. 1 is a conventional metal semiconductor field effect transistor in cross section.
Figure 3:
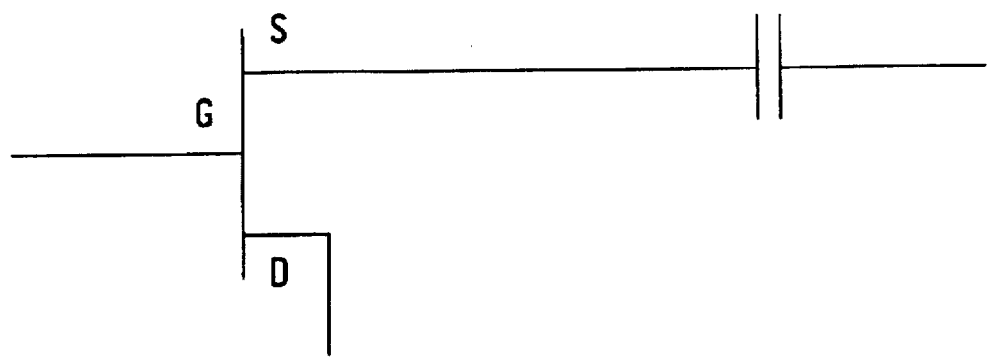
FIG. 3 is a schematic representation of the field effect transistor with a capacitor for the present invention.
Figure 4:
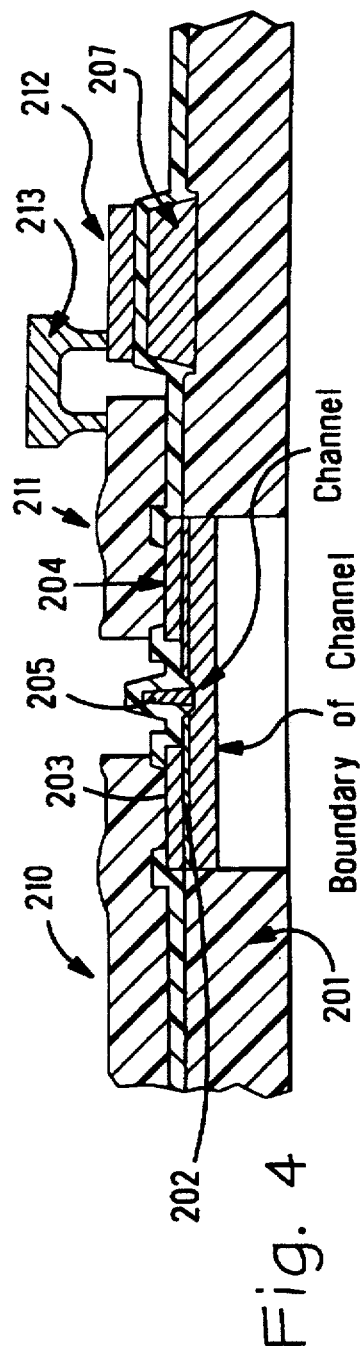
FIG. 4 shows in cross section and detail the various regions of the field effect transistor of the present invention.

FIG. 2 shows the processing steps in fabrication of the field effect transistor and a capacitor shown schematically in FIG. 3. FIG. 2a shows the substrate 201 of gallium arsenide which is semi-insulating. The top layer 202 is the ohmic contact layer having been doped with silicon. Ion implantation of silicon in a dose of $0.6-3.1\times10^{13}$ ions/cm$^2$ having an energy on the order of approximately 10–20 KeV electron volts is carried out through standard technique to form this layer. Thereafter, silicon in the dose of $5-8.5\times10^{-2}$ ions per cm$^2$ at 100–140 KeV is implanted through standard ion implantation techniques to form the active channel. These implantation concentrations and energies to form the ohmic contact layer and active channel are merely exemplary. To this end, the blanket implant of Si is done to effect the ohmic contact region 202 under the source and drain. That is to say, in a blanket implantation step the ohmic contact regions for the drain and the source are effected. This fabrication of the ohmic contact region is achieved through a relatively high ion concentration at a low implant energy. Thereafter, the channel is fabricated below the gate as is shown in FIG. 4. This fabrication step is effected by a relatively low ion concentration at a relatively high energy. This fabricates the doped channel in a way to reduce the pinch-off voltage as has been described above. Finally, the beryllium is implanted at a relatively low ion concentration and at a relatively high energy level to define the boundaries of the channel. Typically, a dose of $1-2\times10^{12}$ ions/cm$^2$ at an energy of 80–110 KeV is used in this step. As can be appreciated from one of ordinary skill in the art, the low energy ion implantation steps effect implants close to the surface, whereas those at a relatively high energy effect the implants at greater depths. Accordingly, the ion implantation of the ohmic contact region is done at a lower implant energy, while that of the channel fabrication by implantation of silicon and beryllium is done at a higher implantation energy.

The resulting ohmic contact region 401 for the drain, the source and the gate has a doping level of approximately $1-2\times10^{18}$/cm$^3$. The channel has a doping level on the order of $2-4\times10^{17}$/cm$^3$. The beryllium doping level which defines the boundaries of the channel is on the order of $2-4\times10^{16}$/cm$^3$. Clearly, to one of ordinary skill in the art, other implant concentrations and energies can be used to effect the ohmic contact region of the gate, drain and source, the channel and the boundaries of the channel in the doping levels above described.

Figure 2A:
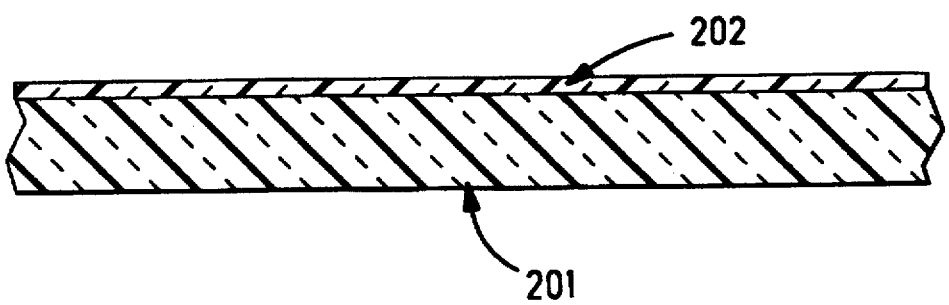
FIG. 2a–2h shows the processing steps to fabricate the field effect transistor of the present invention.
Figure 2B:
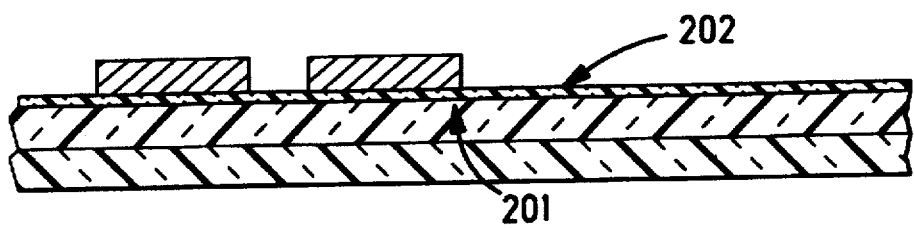
Figure 2C:
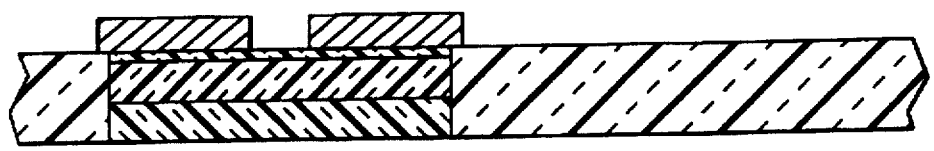

As can be appreciated, the implantation of silicon in a multistep process effects the desired conductivity parameters in the channel as well as the ohmic contact region of the drain, the gate and the source. Furthermore, the final step of implanting beryllium after the two step silicon donor dopant implant is effected to define the boundaries of the channel. Thereafter, annealing is carried out at a temperature in the range of approximately 800°–850° C. for a prescribed period of time. Ohmic contacts are then deposited of preferably an alloy of Au/Ge/Ni/Au. After the fabrication of the contact metallization for the source 203 and drain 204 as is shown in FIG. 2b, isolation of the devices on a wafer during fabrication is achieved by suitable ion implantation of ions of preferably boron, however ions of hydrogen will also work.

Figure 2D:
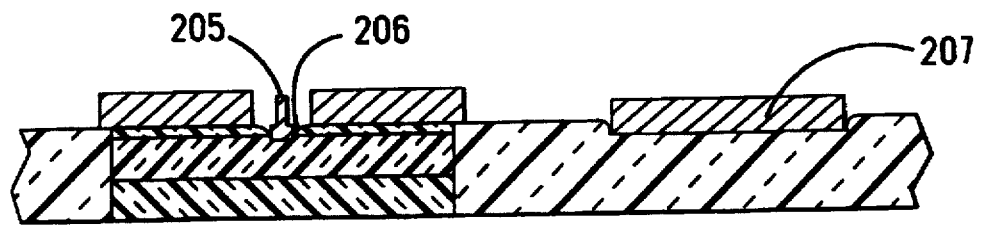

As illustrated in FIG. 2d, the fabrication of the gate contact 205 is effected. There is a slight recess as is well known to one of ordinary skill in the art in the fabrication of the gate region, which is achieved through standard photoresist and etching processes. The metal contact 205 is effected through standard metal deposition techniques. Finally, as is shown in FIG. 2d, the lower metal plate 207 for the capacitor of the control FET is shown.

Figure 2E:
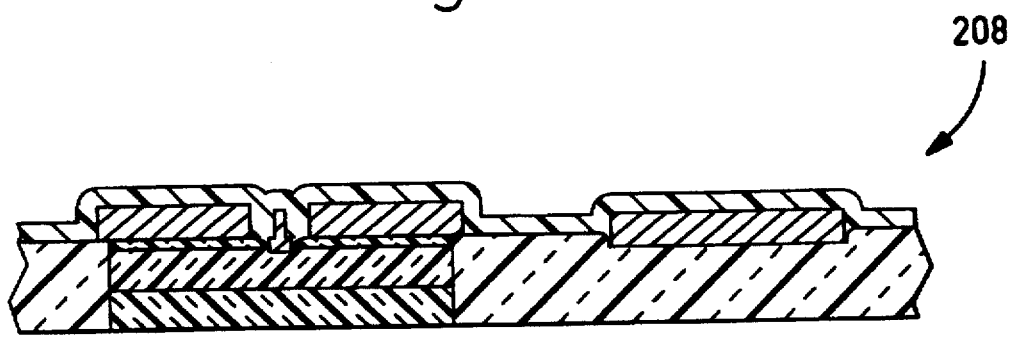
Figure 2F:
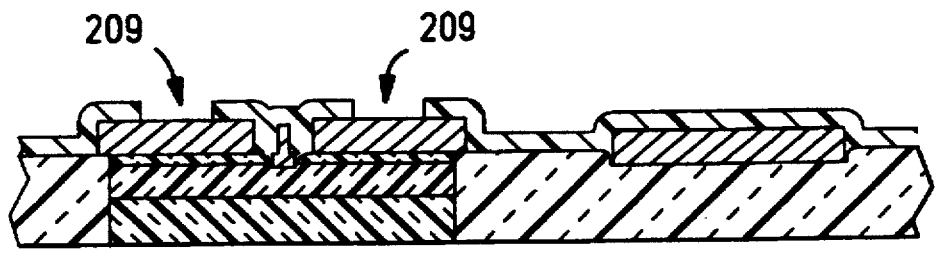
Figure 2G:
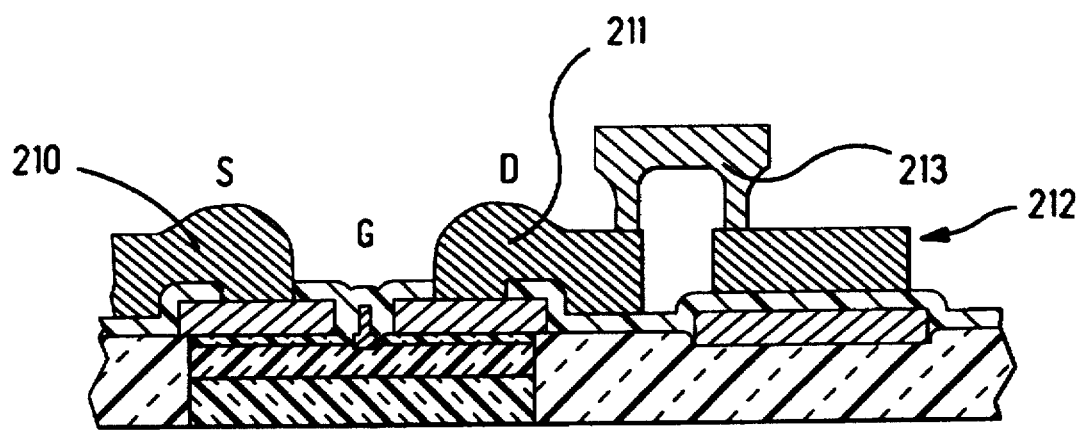
Figure 2H:
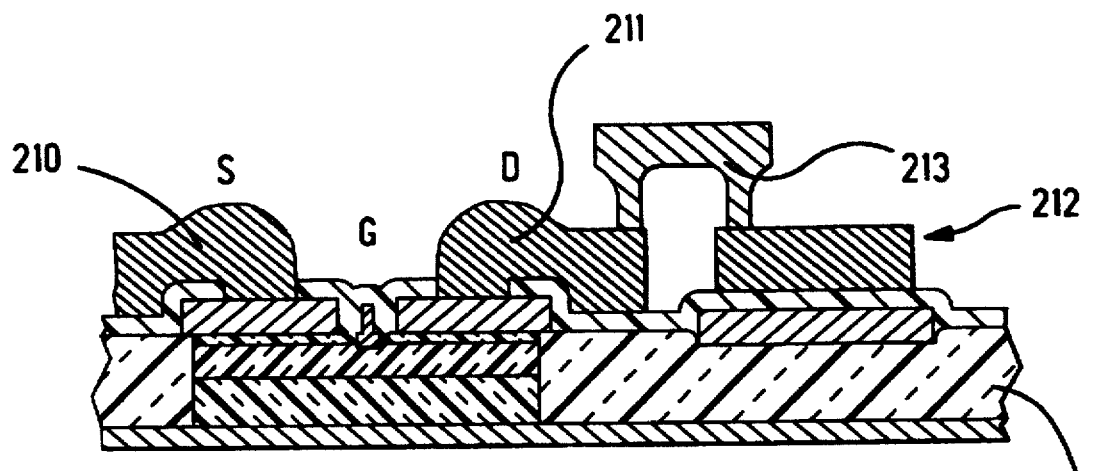

FIG. 2e shows the deposition of $Si_3N_4$ which is effected for passivation purposes as well as to provide the dielectric for passive elements such as a capacitor. Thereafter, as shown in FIG. 2f, vias are etched at 209 to provide access for metallization. Then, a standard metal overlay is done to provide the contacts for the source and drain as well as the top plate of the capacitor shown at 210, 211, and 212 respectively. Finally, the airspan member 213 provides the necessary electrical connection. In the final step of the sequence, the substrate 201 is thinned by grinding from its original thickness on the order of 25 mils to a thickness on the order of between 4 and 10 mils for suitable performance characteristics at high frequency.

As stated above, the primary purpose of the use of beryllium is to give a well defined channel within the semi-insulating substrate. This is as shown in FIG. 4. As stated, the use of beryllium is to eliminate the potential for implantation tails in the channel which can occur as a result of the two stage silicon implantation process described above. To this end, the silicon implantation enables the low control voltage on the order of three volts, through the results in higher doping levels in the channel. However, this silicon implantation has the attendant problem of creating boundaries of the channel which are not well defined. These are known as "tails". Beryllium, an acceptor ion, is implanted at a suitable location and depth to compensate the tails created by the silicon implantation. The problem that the tails of a channel that is not well defined is that there are stray currents that can arise during the operation of the field effect transistor. These stray currents are manifest in an increased pinch off voltage and a reduced pinch off voltage control. While beryllium functions very well as an acceptor ion in implantation steps to effect the well defined channel, ion implantation of other impurities such as carbon are possible. Because of the relatively low atomic mass of beryllium, it is the preferred dopant in defining the channel, however carbon is another possible dopant in this role.

Finally, as stated briefly above, the implantation of donor ions of silicon in the concentrations as recited above can affect the capacitance of the device. To this end, the higher doping levels of the active channel result in an increased capacitance of the control device FET's. However, increased FET capacitance adversely affects the frequency operation of the device as is well known to one of ordinary skill in the art. Accordingly, it is necessary to reduce the zero bias gate-source junction capacitance as well as the zero bias gate-drain junction capacitance to as low a level as possible to ensure high frequency performance of the control FET. In the present invention, this is effected by reducing the gate length to on the order of 0.5 microns from on the order of 1 micron in the standard higher pinch off voltage device.

Figure 6:
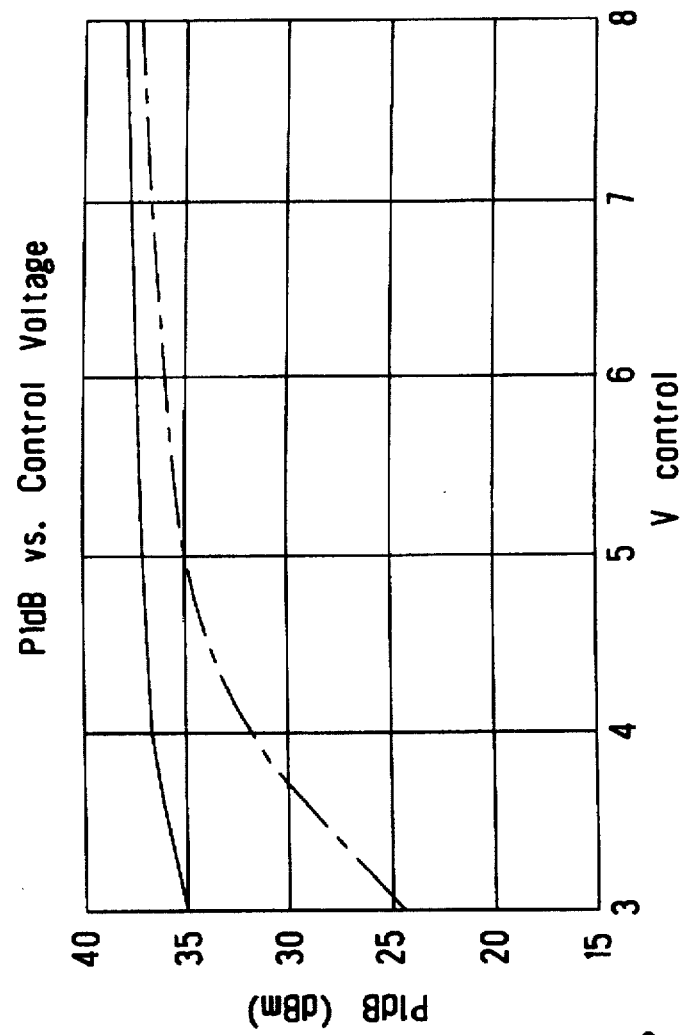
FIGS. 5 and 6 are graphical representations of the P1dB compression point.
Figure 5:
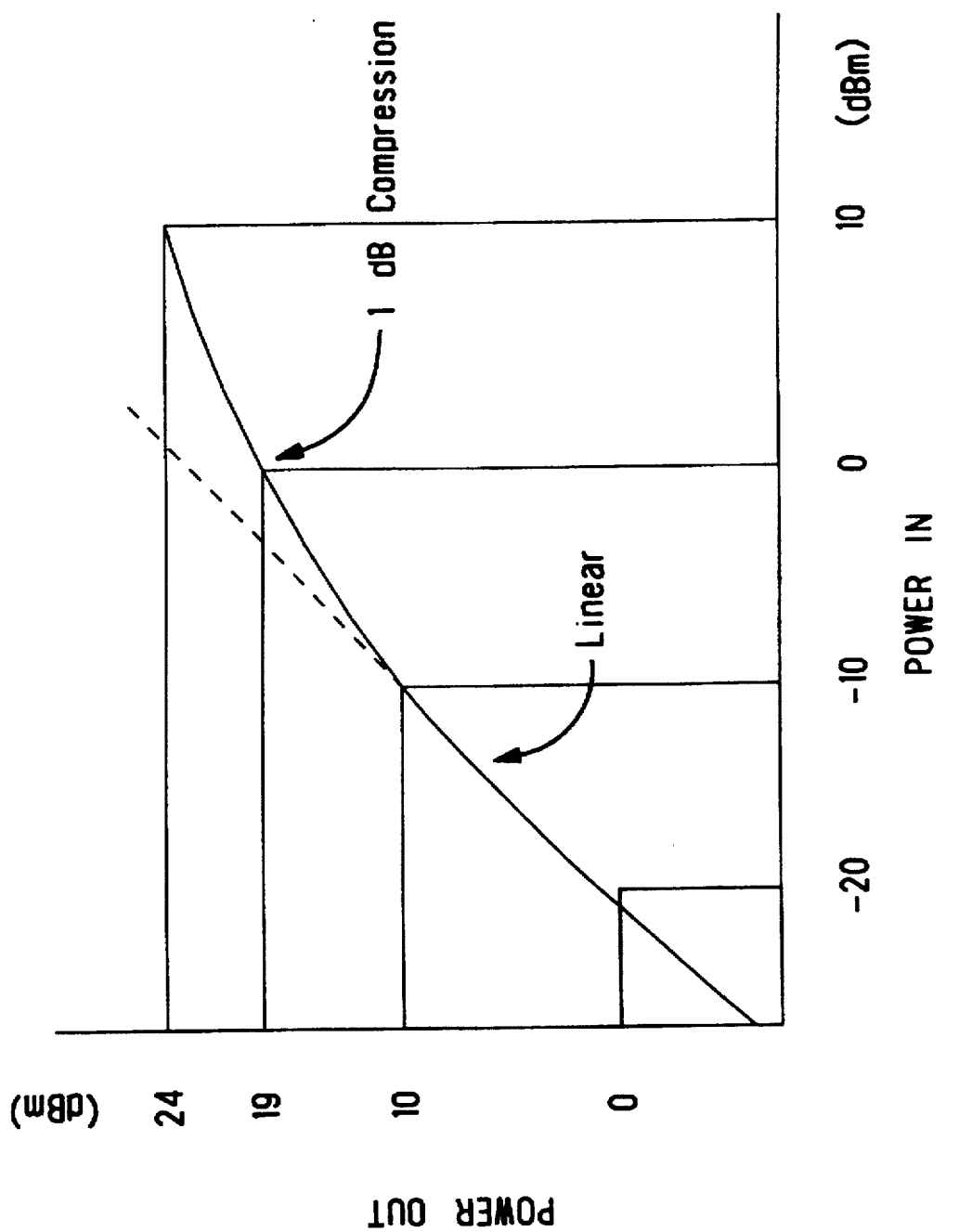

Finally, as is illustrated in FIGS. 5 and 6 the important electrical parameter, the 1 dB compression point, is discussed in detail. $P_{1db}$ is a measure of linearity of the device, an important aspect of a control FET. As the input power of the device increases by one dB the output power should also increase by 1 dB. At a certain point, this linear relationship between the input power and the output power is no longer achieved. At this point, the device is said to be going into compression. This is shown clearly in FIG. 5. $P_{1db}$ is the point of compression where the difference between the measured output power is 1 dB below what would be expected for this increase in input power. Turning to FIG. 6, a plot of the 1 dB compression point versus control voltage on a single pole-double throw switch is shown. As can be seen in FIG. 6, the 1 dB compression point for the standard one micron process bias at 5 volts is equivalent to the new 0.5 micron device biased at 3 volts. Accordingly, the field effect transistor of the present invention can be biased at 3 volts yet it exhibits the same power performance as conventional field effect transistors biased at 5 volts. As recited above, this will allow the user of any type of battery operated system to utilize a lower voltage and extend the battery life in the ultimate operation of the unit.

The invention having been described in detail, it is clear that there are modifications to the materials and processes disclosed. To the extent that such modifications are apparent to the artisan of ordinary skill, such modifications to effect a low control voltage MESFET are considered within the scope of the present invention.

I claim:

1. A metal semiconductor field effect transistor (MESFET), comprising:

a substrate, a drain, a source, a gate and a channel, said channel having a depth on the order of 2000 Angstroms; and said channel being defined by a co-implantation of Si and Be to effect desired doping levels of Si and Be to effect a pinch-off voltage on the order of 1.3–1.5 volts.

2. A MESFET as recited in claim 1, wherein concentration of Si is in the range $2-4 \times 10^{17}$ cm$^{-3}$.

3. A MESFET as recited in claim 1, wherein said MESFET has a 1 dB compression point at an output power of 19 dBm at an input power of 0 dBm.

4. A MESFET as recited in claim 1, wherein said MESFET has a 1 dB compression point at 35 dBm at a control voltage of 3V.

5. A control metal semiconductor field effect transistor (MESFET) comprising a GaAs substrate, said substrate having a drain, a source and a channel disposed therein, said channel having a donor dopant with a concentration of $2-4 \times 10^{17}$ cm$^{-3}$ and a depth on the order of 2000 Angstroms and said channel boundary defined by an acceptor dopant having a concentration of $2-4 \times 10^{16}$ cm$^{-3}$; and a gate disposed on top of said channel, said gate having a width on the order of 0.5 microns.

6. A MESFET as recited in claim 5, wherein said donor dopant is Si.

7. A MESFET as recited in claim 6, wherein said acceptor dopant is Be.

8. A MESFET as recited in claim 7, wherein said channel boundary defined by said acceptor dopant compensates for tails created by said donor dopant and reduces stray current in the channel.

9. A MESFET as recited in claim 8, wherein said MESFET has a pinch off voltage on the order of 1.3–1.5 volts.

10. A MESFET as recited in claim 6, wherein said MESFET has a 1 dB compression point at 35 dBm at a control voltage of 3V.

11. A MESFET as recited in claim 6, wherein said has a 1 dB compression point at an output power of 19 dBm at an input power of 0 dBm.

12. A MESFET as recited in claim 5, wherein said acceptor dopant is carbon.

13. A metal semiconductor field effect transistor (MESFET), comprising a GaAs substrate, said substrate having a drain, a source and a channel disposed therein said channel being doped with silicon and said channel having a boundary defined by Be doping; and said MESFET having a pinch-off voltage of 1.3–1.5 volts.

14. A MESFET, as recited in claim 13 wherein in said silicon has a concentration of $2-4 \times 10^{17}$ cm$^{-3}$.

15. A MESFET, as recited in claim 13 wherein said borillium has a concentration of $2-4 \times 10^{16}$ cm$^{-3}$.

16. A MESFET, as recited in claim 13 wherein said channel has a depth on the order of 2,000 Angstroms.

17. A MESFET as recited in claim 13 wherein said gate has a width of 0.5 microns.

18. A MESFET as recited in claim 13, wherein said MESFET has a 1 dB compression point at 35 dBm at a control voltage of 3V.

19. A MESFET as recited in claim 13, wherein said has a 1 dB compression point at an output power of 19 dBm at an input power of 0 dBm.

20. A MESFET as recited in claim 13, wherein said channel boundary defined by said acceptor dopant compensates for tails created by said donor dopant and reduces stray current in the channel.

* * * * *